United States Patent
Sakai

(10) Patent No.: US 8,697,551 B2
(45) Date of Patent: Apr. 15, 2014

(54) CRYSTALLINE ALUMINUM CARBIDE THIN FILM, SEMICONDUCTOR SUBSTRATE HAVING THE ALUMINUM CARBIDE THIN FILM FORMED THEREON AND METHOD OF FABRICATING THE SAME

(71) Applicant: Seoul Opto Device Co., Ltd., Ansan-si (KR)

(72) Inventor: Shiro Sakai, Tokushima (JP)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 13/871,497

(22) Filed: Apr. 26, 2013

(65) Prior Publication Data

US 2013/0237037 A1    Sep. 12, 2013

Related U.S. Application Data

(62) Division of application No. 13/091,581, filed on Apr. 21, 2011.

(30) Foreign Application Priority Data

Jan. 28, 2011  (JP) ................................ 2011-016085

(51) Int. Cl.
*H01L 21/02*    (2006.01)

(52) U.S. Cl.
USPC ................... 438/478; 438/479; 257/E21.054; 257/E21.121

(58) Field of Classification Search
USPC ............ 257/E21.054, E21.121; 438/478, 479
See application file for complete search history.

(56) References Cited

U.S. PATENT DOCUMENTS

| | | | |
|---|---|---|---|
| 5,632,827 A | 5/1997 | Fujita et al. | |
| 2006/0171102 A1 | 8/2006 | Ro et al. | |
| 2007/0080352 A1 | 4/2007 | Wu et al. | |
| 2013/0313577 A1* | 11/2013 | Sakai | ............................ 257/77 |

FOREIGN PATENT DOCUMENTS

JP    52061475    5/1977

OTHER PUBLICATIONS

"Composition and Mechanical Properties of AlC, AlN and AlCN thin films obtained by r.f. magnetron sputtering" by L. Yate et al., Surface and Coatings Technology, 203, 1904-1907 (2009).
Notice of Allowance dated Sep. 27, 2013 in U.S. Appl. No. 13/091,581.
Non-Final Office Action dated Jun. 19, 2013 in U.S. Appl. No. 13/091,581.

* cited by examiner

*Primary Examiner* — Minh-Loan T Tran
(74) *Attorney, Agent, or Firm* — H.C. Park & Associates, PLC

(57) ABSTRACT

Embodiments of the invention provide a crystalline aluminum carbide thin film, a semiconductor substrate having the crystalline aluminum carbide thin film formed thereon, and a method of fabricating the same. Further, the method of fabricating the AlC thin film includes supplying a carbon containing gas and an aluminum containing gas to a furnace, to growing AlC crystals on a substrate.

16 Claims, 9 Drawing Sheets

100

CRYSTALLINE ALUMINUM CARBIDE THIN FILM, SEMICONDUCTOR SUBSTRATE HAVING THE ALUMINUM CARBIDE THIN FILM FORMED THEREON AND METHOD OF FABRICATING THE SAME

CROSS-REFERENCE TO RELATED APPLICATIONS

This application is a divisional of U.S. application Ser. No. 13/091,581, filed on Apr. 21, 2011, which claims priority from and the benefit of Japanese Patent Application No. JP2011-016085, filed on Jan. 28, 2011, which is hereby incorporated by reference for all purposes as if fully set forth herein.

BACKGROUND OF THE INVENTION

1. Field of the Invention

Exemplary embodiments of the present invention relate to a crystalline aluminum carbide thin film, a semiconductor substrate having a crystalline aluminum carbide thin film formed thereon, and a method of fabricating the same.

2. Discussion of the Background

A light emitting diode (LED) including a gallium nitride (GaN) based semiconductor may be used for various applications, such as signal devices, backlight units for liquid crystal panels, and the like. Since AlGaInN-based LEDs have a wavelength band of 260~290 nm or 360~600 nm, an AlGaN-based active layer may be included to produce a shorter wavelength band (300~340 nm). As such, $Al_xGa_{1-x}N$-based semiconductor materials have been continuously developed. At a wavelength of 280 nm, it is possible to obtain a light extraction efficiency of 10% or more.

However, since AlGaN is liable to be split and has higher dislocation density, an AlGaN material used in a wavelength band from 300 nm to 360 nm has not yet been developed. Current reports say that LEDs exhibit a light extraction efficiency of at most 8%, in a wavelength band of 300~350 nm.

Generally, elements located at an upper part of the periodic table emit light at shorter wavelengths. Although BN or C have the shortest wavelengths, these components are not suited for general light emitting materials, since the growth of these materials requires high temperatures of 2500° C. or more. AlN may be used instead of these materials. Namely, investigations have been made to develop a material that emits light at a short wavelength (λ=210 nm) using AlN. However, AlGaN has a low light extraction efficiency, as described above.

Meanwhile, aluminum carbide $Al_4C_3$ (hereinafter, "AlC") is an important compound in aluminum technology, due to its high electric resistance and high thermal conductivity at room temperature. Since AlCN, which is an aluminum compound similar to AlC, can be used in various applications, such as microelectronics, photonic technology, and the like, due to its wide band gap, high chemical stability, and high hardness, AlC is also anticipated to have the same capabilities as AlCN. AlC is a III-IV group-based material and is generally known as a nano-processing material.

In order to use AlC for a semiconductor substrate, particularly, for LEDs, it is necessary to provide a thin film exhibiting excellent crystallinity. However, crystalline thin films formed using AlC has not yet been developed. Currently, only a non-crystalline thin film of AlC is reported by L. Yate et al., Surface and Coatings Technology, 203, 1904 (2009).

SUMMARY OF THE INVENTION

Exemplary embodiments of the invention provide a crystalline aluminum carbide thin film, a semiconductor substrate having the crystalline aluminum carbide thin film formed thereon, and a method of fabricating the same.

Additional features of the invention will be set forth in the description which follows, and in part will be apparent from the description, or may be learned by practice of the invention.

An exemplary embodiment of the invention provides a crystalline aluminum carbide (AlC) thin film. The AlC thin film may emit light at a wavelength in the range of 310 nm to 413 nm in cathode luminescence (CL) measurement. The AlC thin film may have a band gap from 3.4 eV to 4.3 eV in a transmittance measurement. The AlC thin film may be formed on a sapphire substrate or a silicon carbide substrate. The AlC thin film may be formed on a c-plane of the sapphire substrate.

An exemplary embodiment of the invention provides a semiconductor substrate having a crystalline AlC thin film.

An exemplary embodiment of the invention provides a method of fabricating an AlC thin film. The method includes supplying a carbon-containing gas and an aluminum-containing gas to form an AlC thin film, by growing AlC crystals on a substrate.

An exemplary embodiment of the invention provides a method of fabricating a semiconductor substrate having an AlC thin film formed thereon. The method includes supplying a carbon-containing gas and an aluminum containing gas to form an AlC thin film, by growing a AlC crystals on a substrate.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 3($b$) shows a relationship between a flow rate of TMA and a growth rate of the AlC thin film.

FIG. 3($c$) shows a relationship between a IV/III ratio and the growth rate of the AlC thin film.

FIG. 4($b$) is a (SEM) image of an AlC thin film formed at 1150° C.

FIG. 4($c$) is a scanning electron microscope (SEM) image of an AlC thin film formed at 1200° C.

FIG. 5($b$) is an SEM image of a side section of a semiconductor substrate having an AlC film formed at 1200° C.

FIG. 7($b$) shows an energy dispersive X-ray spectrometer (EDX) result for aluminum detection.

FIG. 7($c$) shows an EXD result for carbon detection.

FIG. 7($d$) shows an EXD result for oxygen detection.

DETAILED DESCRIPTION OF THE ILLUSTRATED EMBODIMENTS

Figure 1:
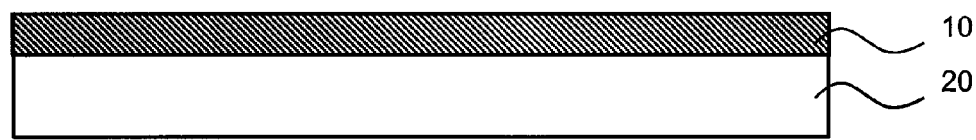
FIG. 1 is a view of a semiconductor substrate, in accordance with an exemplary embodiment of the invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, the sizes and relative sizes of layers and regions may be exaggerated for clarity. Like elements will be denoted by like reference numerals and repeated descriptions thereof will be omitted herein.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

The inventors of the invention investigated materials, fabrication conditions, and the like to obtain a crystalline aluminum carbide thin film (hereinafter, referred to as an "AlC thin film") and finally developed a crystalline AlC thin film on a c-plane of the sapphire substrate.

An AlC thin film, according to an exemplary embodiment of the present disclosure, may be evaluated using a scanning electron microscope (SEM), X-ray diffraction (XRD), an energy dispersive x-ray spectrometer (EDX), cathode luminescence (CL), and/or a transmittance measurement. Since $Al_4C_3$ generally has a yellow color, when the AlC thin film is formed on a substrate formed of a different material than the AlC thin film, AlC thin film can be observed with the naked eye or an optical microscope, in that the substrate appears to have a yellow color. Further, it can be seen through SEM observation that crystals are grown on the substrate. Through an SEM image of a side section of the substrate, the AlC thin film is shown to be formed on the substrate.

The AlC thin film has a peak near 35° in 2θ-w mode of XRD, which is caused by $Al_4C_3$ crystals. Further, when the AlC thin film is formed on a substrate having a different crystal structure from the $Al_4C_3$ crystals, peaks caused by the crystals of the substrate are also detected. For example, when the AlC thin film is formed on a c-plane of a sapphire substrate, peaks near 38° and 42° are detected, which are caused by the sapphire substrate.

An EDX image shows the presence of aluminum and carbon in the AlC thin film. In the EDX image showing the presence of aluminum and carbon, since the AlC thin film has crystallinity, aluminum and carbon are detected in a dispersed state. The aluminum and carbon may be uniformly dispersed in the AlC thin film.

In a CL measurement, the AlC thin film emits light in a wavelength range of from 310 nm to 413 nm, which is caused by the $Al_4C_3$ crystals. The AlC thin film has a peak near 340 nm and exhibits light extraction in a wavelength band of 300-350 nm, when used in an LED.

In a transmittance measurement, the AlC thin film has a band gap of from 3.4 eV to 4.3 eV. Further, the AlC thin film has a direct transition in the region of the band gap, that is, in a luminescence energy region. Here, the direct transition refers to a state in which the square of the transmittance ratio is proportional to energy, in a plot of values obtained by dividing the transmittance ratio of the $Al_4C_3$/substrate by the transmittance ratio of the substrate, with respect to the energy. Further, the AlC thin film may be adjusted to have an indirect band gap, by adjusting a fabrication temperature thereof.

As described above, although only a non-crystalline AlC thin film has been reported in the art, the present crystalline AlC thin film may be applied to a crystalline semiconductor layer, which demonstrates the characteristics described above. Further, when used in an LED, the AlC thin film exhibits light extraction in the wavelength band of 300-350 nm.

FIG. 1 is a view of a semiconductor substrate 100, in accordance with an exemplary embodiment of the invention. The semiconductor substrate 100 includes an AlC thin film 10 formed on an upper surface of a substrate 20. Here, the substrate 20 may be any type of substrate that can be used for AlC crystal growth in the field of semiconductors, particularly, in the field of LEDs. For example, the substrate 20 may be a sapphire substrate or a silicon carbide substrate. When the sapphire substrate is used as the substrate 20, the AlC thin film 10 may be formed on a c-plane of the sapphire substrate 20.

The semiconductor substrate 100 may be evaluated using a scanning electron microscope (SEM), X-ray diffraction (XRD), energy dispersive x-ray spectroscopy (EDX), cathode luminescence (CL), and transmittance measurements.

When observed with the naked eye or an optical microscope, the AlC thin film 10 formed on the substrate 20 can be observed to impart a yellow color to the substrate. Further, using a SEM, it can be seen that crystals are grown on the substrate 20. Through an SEM image of a side section of the substrate, the AlC thin film 10 is shown to be formed on the substrate 20.

The AlC thin film 10 has a peak near 35° in 2θ-w mode of XRD, which is caused by $Al_4C_3$ crystals. Further, peaks caused by the crystal of the substrate 20 are detected, in addition to the peaks caused by the $Al_4C_3$ crystals. For example, when the AlC thin film 10 is formed on a c-plane of the sapphire substrate 20, peaks near 38° and 42° are detected, which are caused by the sapphire substrate 20.

An EDX image shows the presence of aluminum and carbon in the semiconductor substrate 100. In the EDX image showing the presence of aluminum and carbon, since the AlC thin film 10 is crystalline, aluminum and carbon are detected in a dispersed state. In this embodiment, aluminum and carbon may be uniformly dispersed in the AlC thin film 10. Further, when a sapphire substrate is used as the substrate 20, aluminum is also detected in the sapphire substrate, whereas carbon is detected in the AlC thin film 10.

In a CL measurement, the semiconductor substrate 100 emits light in the wavelength range of from 310 nm to 413 nm, as a result of the $Al_4C_3$ crystals. The semiconductor substrate 100 has a peak near 340 nm and exhibits light extraction in a wavelength band of 300-350 nm, when used in an LED.

In transmittance measurement, the semiconductor substrate 100 has a band gap of from 3.4 eV to 4.3 eV. Further, the semiconductor substrate 100 has a direct transition in the region of the band gap, that is, in a luminescence energy region. Further, the semiconductor substrate 100 may be adjusted to have an indirect band gap, by controlling the fabrication temperature thereof.

As described above, although an AlC thin film only for a non-crystalline thin film has been reported in the art, the semiconductor substrate 100 may allow a crystalline AlC thin film to be formed. Accordingly, the semiconductor substrate 100 demonstrates the characteristics described above. Further, when used in an LED, the semiconductor substrate 100 exhibits light extraction in the wavelength band of 300-350 nm.

Metal organic vapor deposition (MOCVD) may be used to fabricate the crystalline AlC thin 10 film and the semiconductor substrate 100. In this embodiment, the crystalline AlC thin film 10 is grown on an upper surface of the substrate 20.

Raw materials for the AlC thin film 10 include a carbon-containing gas and an aluminum-containing gas. The carbon-containing gas may be methane ($CH_4$) and the aluminum-containing gas may be tri-methyl aluminum (($CH_3)_3Al$; hereinafter "TMA"). Further, hydrogen ($H_2$) may be used as a carrier gas. The respective raw materials may be commercial materials used in the field of semiconductors, particularly, in the field of LEDs.

The TMA may be may be supplied at flow rates of from 33 μmol/min to 66 μmol/min, and the methane may be supplied at flow rates of 13 mmol/min to 27 mmol/min, to grow the AlC crystals. Further, the AlC crystals are grown at a temperature of 700° C. or more, or at a temperature of 1100° C. or more. Although time for growing the AlC crystals depends on the flow rate of raw materials and/or the thickness of the AlC thin film 10, the time for growing the AlC crystals may be in the range of, for example, 60-120 minutes. The substrate 20 may be annealed, by supplying hydrogen gas before growing the AlC crystals. Annealing may be performed at 1150° C. for 10 minutes, for example, when the flow rate of hydrogen gas is 10 slm.

By the method described above, it is possible to form a crystalline AlC thin film on a semiconductor substrate. Accordingly, the semiconductor substrate demonstrates the characteristics described above. Further, when used in an LED, the semiconductor substrate exhibits light extraction in the wavelength band of 300-350 nm.

Figure 2:
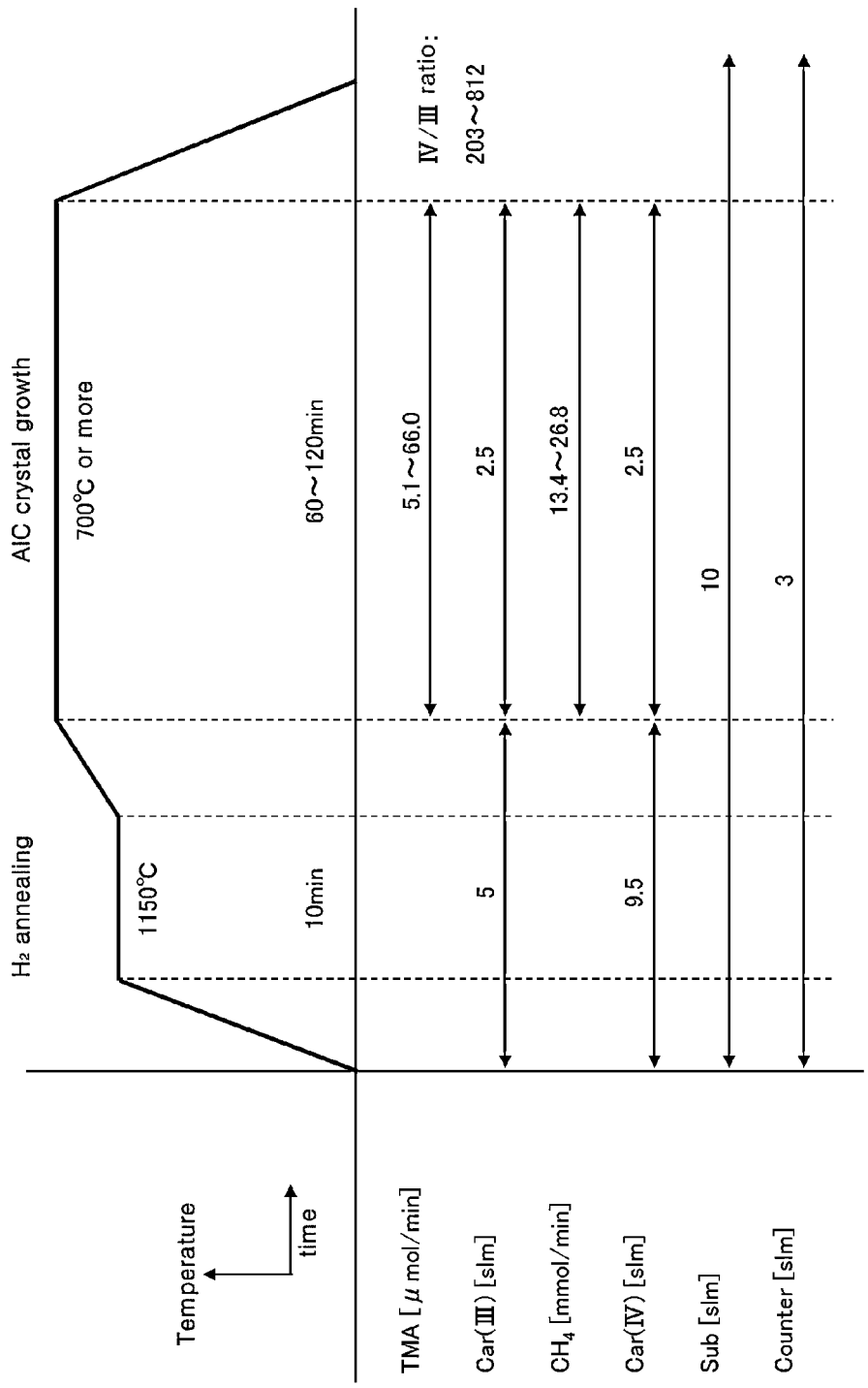
FIG. 2 is a graph depicting conditions for fabricating an AlC thin film on the semiconductor substrate, in accordance with an exemplary embodiment of the invention.

FIG. 2 is a graph depicting conditions for fabricating the AlC thin film 10 formed on the semiconductor substrate 100, in accordance with an exemplary embodiment of the invention. In FIG. 2, "Car(III)" indicates the flow rate of hydrogen supplied as the carrier gas of TMA, "Car(IV)" indicates the flow rate of hydrogen supplied as the carrier gas of $CH_4$, "Sub" indicates the flow rate of hydrogen for re-dilution of Car(III) and Car(IV), and "Counter" indicates the flow rate of nitrogen towards an upper side of a furnace that faces the substrate 100.

Figure 3A:
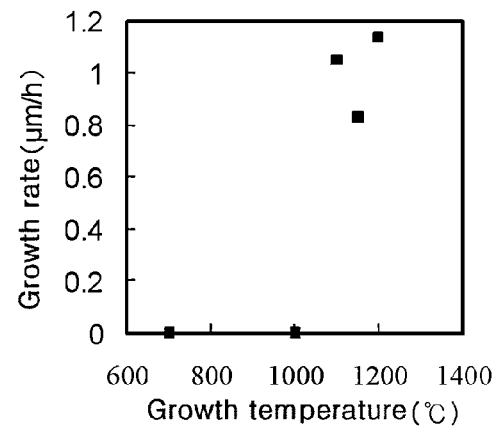
FIG. 3($a$) shows a relationship between a growth temperature and a growth rate of an AlC thin film, in accordance with an exemplary embodiment of the invention.

FIG. 3(a) shows a relationship between the growth temperature and the growth rate of the AlC thin film 10. Although the AlC thin film 10 could be grown at a temperature of 700° C., the growth rate was slow at this temperature. A meaningful growth rate could be measured beginning at a temperature of 1100° C. Further, a furnace used for this example was operated at a temperature of 1200° C.

Figure 4A:
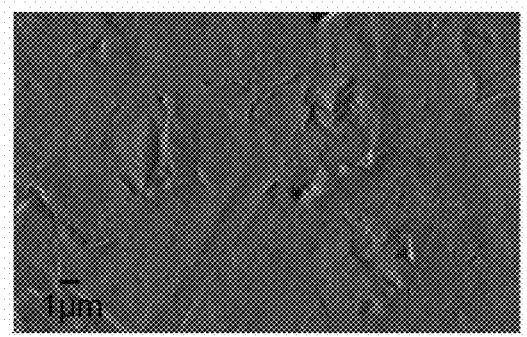
FIG. 4($a$) is a scanning electron microscope (SEM) image of an AlC thin film formed at 700° C.
Figure 4B:
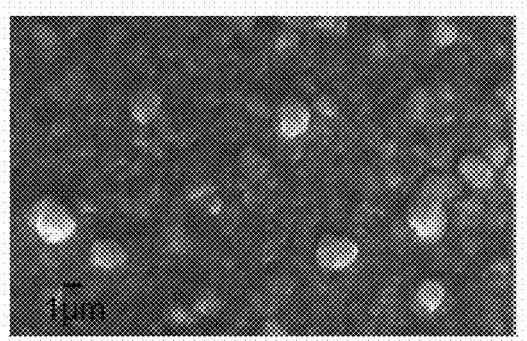
Figure 4C:
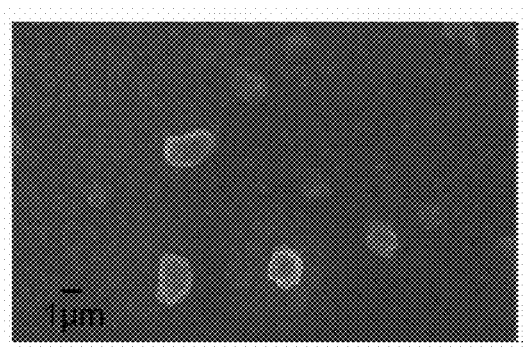

FIGS. 4(a), 4(b), and 4(c) are SEM images of AlC thin films formed at 700° C., 1150° C., and 1200° C., respectively. Each of the figures is obtained by observing the semiconductor substrate 100 including the AlC thin film 10, from an upper side of the substrate 100. In this example, a SM6499 (Nippon Electronic Corporation) was used as the SEM. At a growth temperature of 1150° C. or more, AlC crystals were observed.

Figure 5A:
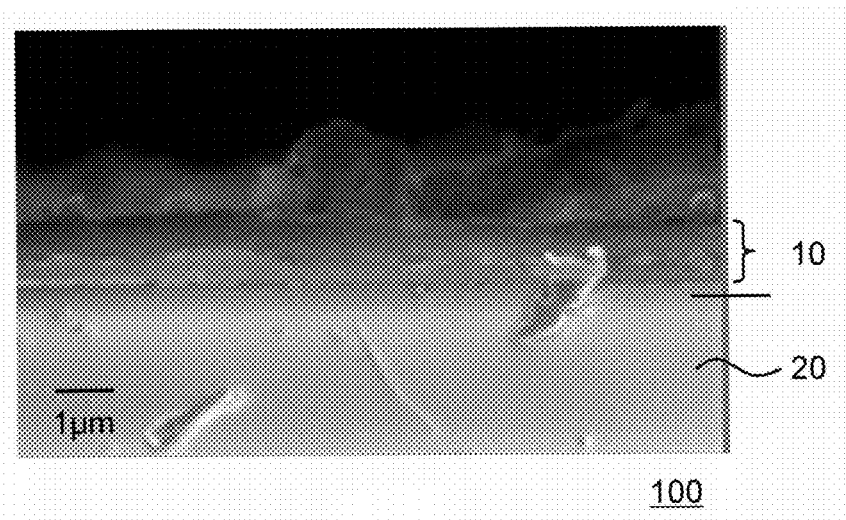
FIG. 5($a$) is an SEM image of a side section of a semiconductor substrate having an AlC film formed at 1150° C.
Figure 5B:
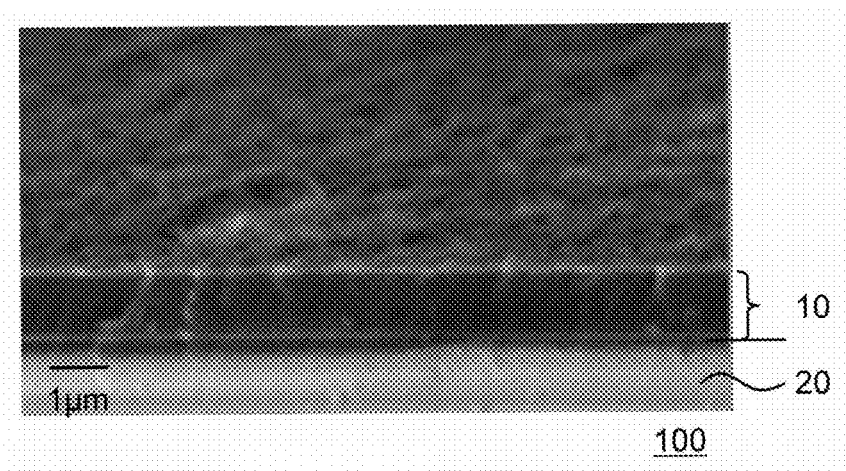

FIGS. 5(a) and 5(b) are SEM images of side sections of semiconductor substrates 100 having AlC thin films formed at 1150° C. and 1200° C., respectively. At 1150° C. and 1200° C., it was observed that AlC thin films 10 were formed on the upper surface of the substrates 20.

Figure 3B:
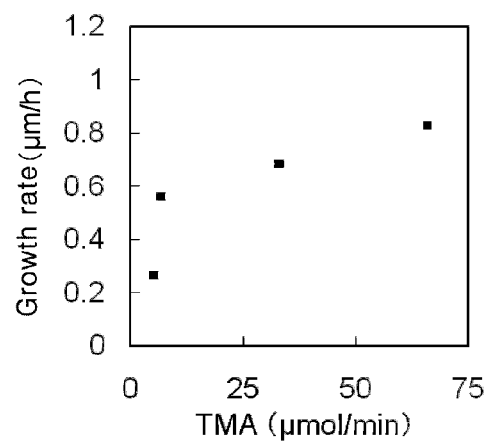

FIG. 3(b) shows the relationship between the flow rates of TMA and the growth rates of AlC thin films. In this example, the growth temperature was set to 1150° C. and the flow rate of methane was set to 13.4 mmol/min. The flow rate of TMA was set to 5.1 μmol/min, 6.6 μmol/min, 33 μmol/min, and 66 μmol/min. As the flow rate of TMA increased, the growth rate of the AlC thin film increased.

Figure 3C:
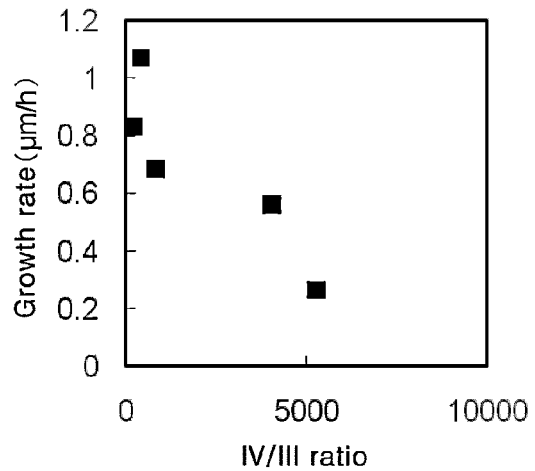

FIG. 3(c) shows a relationship between the IV/III ratio and the growth rate of the AlC thin films. In this example, the growth temperature was set to 1150° C. The IV/III ratio was set to 203, 406, 812, 4032, and 5261. At a IV/III ratio of 406, the highest growth rate was achieved.

Figure 6:
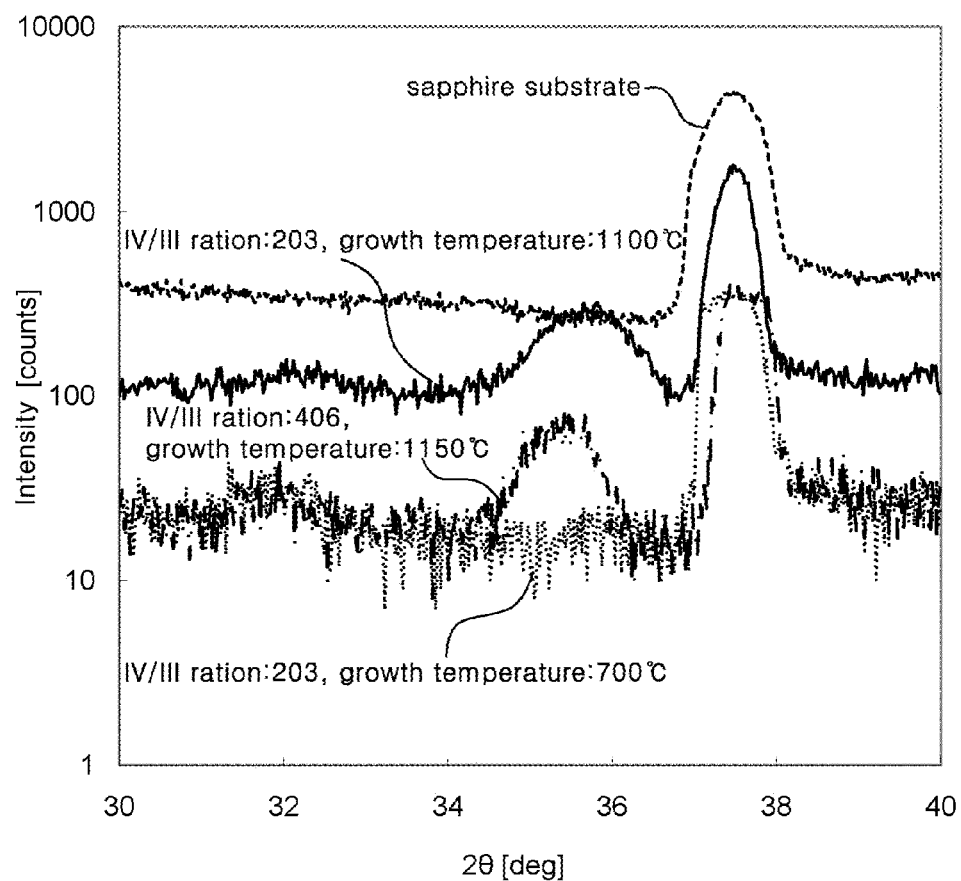
FIG. 6 is a graph of an XRD measurement of the semiconductor substrate.

FIG. 6 shows XRD measurement results. In this example, an X'pert MRD (Philips Co., Ltd.) was used as the XRD apparatus. The peaks caused by sapphire used for the substrate were observed near 38° and 42°. For the AlC thin films formed at 1100° C. and 1150° C., a peak caused by the $Al_4C_3$ crystals was detected near 35°, in addition to the peaks caused by sapphire. The AlC thin film formed even at a growth temperature of 700° C. had low growth efficiency. As a result, when the thin film was grown for 60 minutes in this example, the $Al_4C_3$ crystal peak was not detected.

Figure 7A:
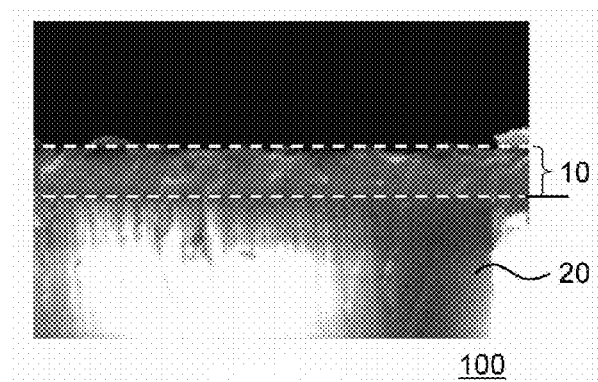
FIG. 7($a$) is an SEM image of a side section of the semiconductor substrate.
Figure 7B:
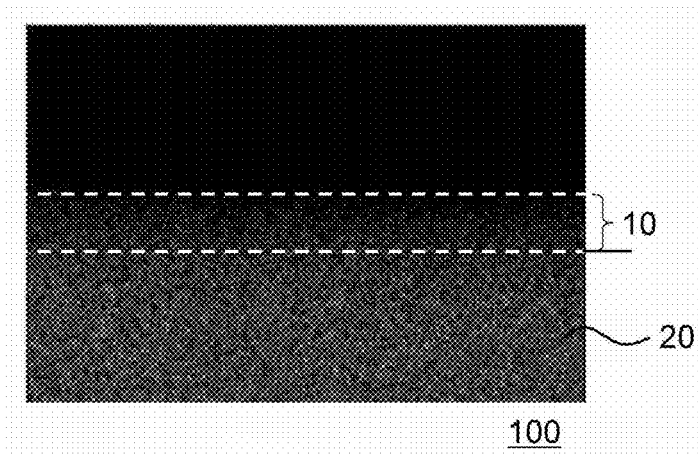
Figure 7C:
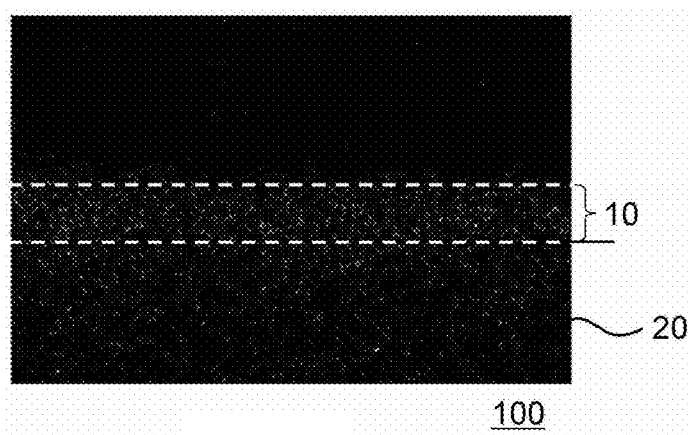
Figure 7D:
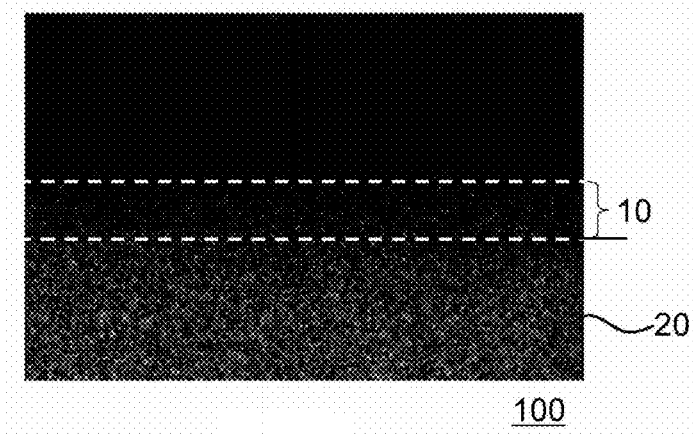

Next, the semiconductor substrate 100 having the AlC thin film 10 formed thereon was examined by EDX. In this example, a Link ISIS (Oxford Co., Ltd.) was used as the EDX. FIG. 7(a) is a SEM image of a side section of the semiconductor substrate 100, FIG. 7(b) shows a result of aluminum detection, FIG. 7(c) shows a result of carbon detection, and FIG. 7(d) shows a result of oxygen detection. Aluminum was detected in both the AlC thin film 10 and the sapphire substrate 20. Carbon was detected in the AlC thin film 10, and oxygen was detected in the sapphire substrate 20. From these results, it can be seen that the AlC thin film 10 is formed on the upper surface of the sapphire substrate 20.

Figure 8A:
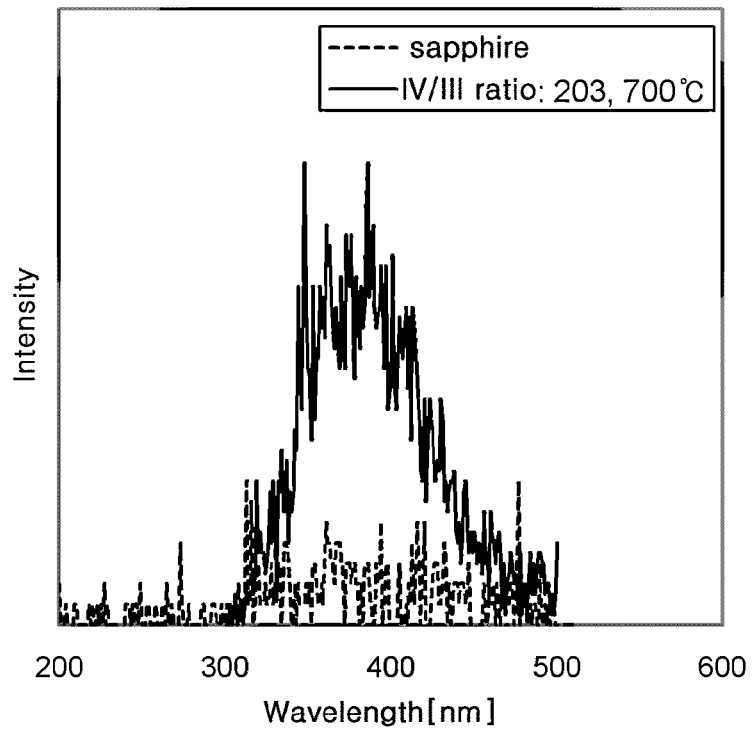
FIG. 8(a) shows a CL measurement of an AlC thin film formed at 700° C.
Figure 8B:
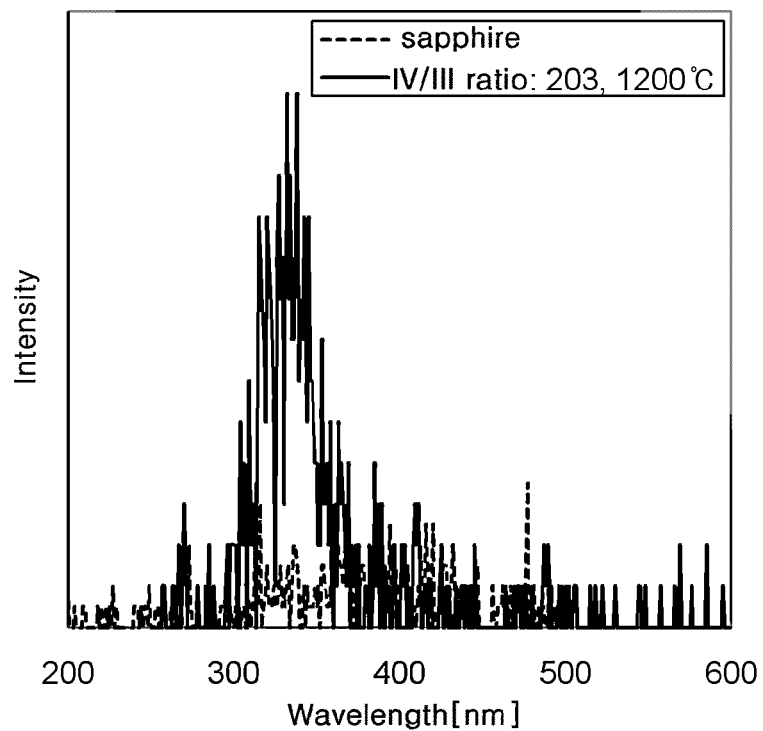
FIG. 8(b) shows a CL measurement of an AlC thin film formed at 1200° C.

Next, a CL measurement was performed with respect to the semiconductor substrate 100 having the AlC thin film 10 formed thereon. In this example, a MONO CL2 (Oxford Co., Ltd.) was used as the CL testing apparatus. FIG. 8(a) shows a result of CL measurement for the AlC thin film 10 formed at 700° C., and FIG. 8(b) shows a result of CL measurement for the AlC thin film 10 formed at 1200° C. In the AlC thin film 10 formed at 1200° C., light emission was detected in the wavelength range of 310 nm to 413 nm, typically near a wavelength of 340 nm, and the half width at half maximum was 50 nm. On the other hand, in CL measurement of the AlC thin film 10 formed at 700° C., a wide peak including a wavelength longer than 340 nm was detected. From these results, it can be assumed that the AlC thin film 10 formed at 1200° C. had good film quality.

Figure 9:
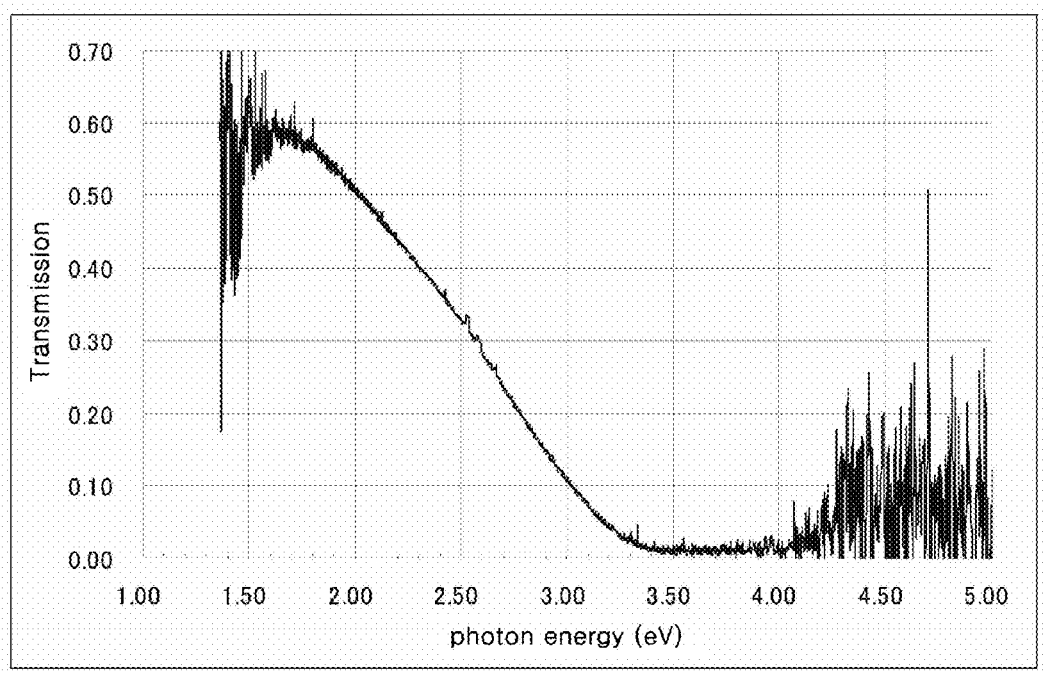
FIG. 9 is a graph depicting a result of transmittance measurement for the semiconductor substrate having the AlC thin film.

Last, transmittance measurement was performed with respect to the semiconductor substrate 100 having the AlC thin film 10 formed thereon. FIG. 9 is a graph depicting a result of the transmittance measurement for the semiconductor substrate 100 having the AlC thin film 10 formed at 1200° C. In the graph of FIG. 9, the band gap of the AlC thin film 10 was typically about 3.4 eV and exhibited a direct transition. In other conditions, the AlC thin film 10 had a band gap of 3.4 eV to 4.3 eV.

As such, the exemplary embodiments of the invention provide a crystalline aluminum carbide thin film, a semiconductor substrate having the crystalline aluminum carbide thin film formed thereon, and a method of fabricating the same.

It will be apparent to those skilled in the art that various modifications and variation can be made in the present invention without departing from the spirit or scope of the inven-

What is claimed is:

1. A method of fabricating a crystalline AlC thin film, comprising:
supplying a carbon-containing gas and an aluminum-containing gas into a furnace, to grow the AlC thin film on a substrate.

2. The method of claim 1, wherein the AlC thin film is grown by metal organic chemical vapor deposition.

3. The method of claim 1, wherein the substrate is a sapphire substrate or a silicon carbide substrate.

4. The method of claim 3, wherein the AlC thin film is formed on a c-plane of the sapphire substrate.

5. The method of claim 1, wherein the carbon containing gas is methane and the aluminum containing gas is tri-methyl aluminum.

6. The method of claim 5, wherein:
the tri-methyl aluminum is supplied at a flow rate of from 33 μmol/min to 66 μmol/min; and
the methane is supplied at a flow rate of from 13 mmol/min to 27 mmol/min.

7. The method of claim 6, wherein the AlC thin film is grown at a temperature of at least 700° C.

8. The method of claim 6, wherein the AlC thin film is grown at a temperature of at least 1100° C.

9. A method of fabricating a semiconductor substrate having a cyrstalline AlC thin film formed thereon, comprising:
supplying a carbon containing gas and an aluminum containing gas to a furnace, grow the AlC thin film on a substrate.

10. The method of claim 9, wherein the AlC thin film is grown by metalorganic chemical vapor deposition.

11. The method of claim 9, wherein the substrate is a sapphire substrate or a silicon carbide substrate.

12. The method of claim 9, wherein:
the substrate is a sapphire substrate; and
the AlC thin film is formed on a c-plane of the sapphire substrate.

13. The method of claim 9, wherein the carbon containing gas is methane and the aluminum containing gas is tri-methyl aluminum.

14. The method of claim 13, wherein:
the tri-methyl aluminum is supplied at a flow rate of 33 μmol/min to 66 μmol/min; and
the methane is supplied at a flow rate of 13 mmol/min to 27 mmol/min.

15. The method of claim 14, wherein the AlC thin film is grown at a temperature of at least 700° C.

16. The method of claim 14, wherein the AlC thin film is grown at a temperature of at least 1100° C.

* * * * *